United States Patent
Kim

(10) Patent No.: US 6,531,346 B1
(45) Date of Patent: Mar. 11, 2003

(54) FABRICATION METHOD OF THIN FILM TRANSISTOR SUBSTRATE FOR X-RAY DETECTOR

(75) Inventor: Ik Soo Kim, Koonpo-shi (KR)

(73) Assignee: LG. Philips LCD Co., Ltd. (KR)

( * ) Notice: Subject to any disclaimer, the term of this patent is extended or adjusted under 35 U.S.C. 154(b) by 0 days.

(21) Appl. No.: 09/653,203

(22) Filed: Aug. 31, 2000

(30) Foreign Application Priority Data

Aug. 31, 1999 (KR) ............................................. 99-36717

(51) Int. Cl.⁷ .......................... H01L 21/00; H01L 21/84
(52) U.S. Cl. ........................ 438/149; 438/164; 438/692
(58) Field of Search .......................... 438/149, 30, 164, 438/692; 349/147, 46; 257/59

(56) References Cited

U.S. PATENT DOCUMENTS

| | | | |
|---|---|---|---|
| 5,360,744 A | * 11/1994 | Shimizu et al. | ............. 438/155 |
| 5,828,433 A | * 10/1998 | Shin | ............................ 349/147 |
| 5,998,229 A | * 12/1999 | Lyu et al. | .................... 438/158 |
| 6,255,130 B1 | * 7/2001 | Kim | ............................. 438/30 |

* cited by examiner

Primary Examiner—William David Coleman
(74) Attorney, Agent, or Firm—McKenna Long & Aldridge LLP

(57) ABSTRACT

A method of fabricating a thin film transistor substrate for an X-ray detector reduces the number of steps in etching processes using masks. In the method, a gate line, a gate pad and a gate electrode of a thin film transistor are simultaneously formed on a certain substrate. A gate insulating layer is entirely coated, and then a semiconductor layer of the thin film transistor is formed. A data pad, a data line, source and drain electrodes of the thin film transistor and a ground electrode are simultaneously formed. An electrode for a charging capacitor is formed, and then an insulating film for the charging capacitor is formed. An electrode for preventing an etching of the insulating film for the charging capacitor is formed. A protective film for protecting the thin film transistor is formed. Contact holes are formed in the protective film. Finally, a pixel electrode is provided. Accordingly, the data pad and the data line are formed of a molybdenum metal and at the same layer, and the molybdenum layers of the data pad and the gate pad are connected to the driver IC chip using the wire bonding technique. As a result, the present method is capable of reducing nine-step mask etching processes in the prior art to a seven-step mask etching processes.

15 Claims, 6 Drawing Sheets

//span>
FABRICATION METHOD OF THIN FILM TRANSISTOR SUBSTRATE FOR X-RAY DETECTOR

BACKGROUND OF THE INVENTION

This application claims the benefit of the Korean Patent Application No. P1999-36717 filed on Aug. 31, 1999, which is hereby incorporated by reference for all purposes as if fully set forth herein.

1. Field of the Invention

This invention relates to a photosensitive cell array for detection of non-visible light ray such as an X-ray, etc., and more particularly, to a method of fabricating a thin film transistor substrate for an X-ray detector that reduces the number of steps in an etching process using masks.

2. Discussion of the Related Art

Generally, imaging systems for photographing an object using non-visible light, such as an X-ray, etc., have been used for medical, scientific and industrial applications. These X-ray imaging systems typically convert the X-ray into an electrical signal and include an X-ray detecting panel for detecting an X-ray passing through an object.

As shown in FIG. 1, a conventional X-ray detecting panel includes a photosensitive layer 6 for detecting an X-ray and a thin film transistor substrate 4 for switching and outputting the detected X-ray from the photosensitive layer. The thin film transistor substrate 4 includes pixel electrodes 5 arranged in a pixel unit, and thin film transistors (TFTs), each of which is connected to a charging capacitor Cst, a gate line 3 and a data line (not shown). A dielectric layer 7 and an upper electrode 8 are provided on the upper portion of the photosensitive layer 6. The upper electrode 8 is connected to a high voltage generator 9. The photosensitive layer 6 is made of selenium with a thickness of hundreds of $\mu$m. The photosensitive layer 6 detects an incident X-ray and converts it into an electrical signal. In other words, the photosensitive layer 6 produces an electron-hole pair when an X-ray is incident thereto and separates the electron-hole pair when a high voltage of several kV is applied to the upper electrode 8 by the high voltage generator 9. The pixel electrode 5 charges the charging capacitor Cst with holes produced by detection of an X-ray by the photosensitive layer 6. The thin film transistor produces a gate signal inputted over the gate line 3 to apply a voltage stored in the charging capacitor Cst to the data line. Pixel signals supplied to the data line are applied, via a data reproducer, to a display device.

FIG. 2 is a plan view showing a conventional structure of a thin film transistor substrate. In the thin film transistor substrate of FIG. 2, the pixel electrode 5 is formed at a unit pixel area defined by the gate line 3 and the data line 10. The charging capacitor Cst is formed by the pixel electrode 5 having a storage insulation layer (not shown) and a transparent electrode (not shown) at a lower portion of the pixel electrode 5. A ground electrode 22 is formed across the pixel electrode 5 to reset the residual electric charges of the charging capacitor Cst. The TFT is formed at an intersection between the data line 10 and the gate line 3 and consists of a gate electrode 12 extended from the gate line 3, a drain electrode 16 extended from the data line 10, a source electrode 14 connected to the pixel electrode 5 via a contact hole 15, and a semiconductor layer (not shown) connected to the source electrode 14 and the drain electrode 16. One end of the gate line 3 is provided with a gate pad 18. One end of the data line 10 is provided with a data pad 20. The gate pad 18 and the data pad 20 connect the gate line 3 and the data line 10 to a driver integrated circuit (IC), respectively. The gate line 3, the gate electrode 12 and the gate pad 18 are made of the same metal material and preferably have a structure in which aluminum (Al) and molybdenum (Mo) are sequentially disposed. The data line 10 is made from Mo to reduce its resistance value to produce good signal transfer characteristics. Like the gate pad 18, the data pad 20 has a structure with sequentially-disposed Al and Mo to connect to the driver IC using the aluminum wiring bonding. The data pad 20 is formed in a different layer from the data line 10. Therefore, the data pad 20 and the data line 10 are connected via a contact hole 19 formed through a gate insulating film. The gate pad 18 and the data pad 20 have aluminum layers which are exposed to be connected to the driver IC through the contact holes 17 and 21, respectively.

A method of fabricating the thin film transistor substrate having the structure as mentioned above is described with reference to FIG. 2 to FIG. 6. First, a metal film is formed on the glass substrate 2 using vapor deposition. Using a first mask pattern, gate line 3, a gate electrode 12, gate pad 18 and data pad 20 are formed simultaneously. In this case, the gate electrode 12, the gate line 3, the gate pad 18 and the data pad 20 have sequentially disposed aluminum (Al) 42 and molybdenum Mo 44 structure. Using continuous vapor disposition, a gate insulating film 32, an amorphous silicon layer and an amorphous silicon layer doped with an impurity, hereinafter referred to as "n+ layer", are sequentially formed on the entire surface of the glass substrate 2 having the gate line 3 and the gate electrode 12, etc. Next, the n+ layer and the amorphous silicon layer is patterned using a second mask pattern to provide a semiconductor layer 34 forming a channel of the thin film transistor. After the semiconductor layer 34 is formed, the gate insulating film 32 on the data pad 20 is patterned using a third mask pattern so as to form an exposed region as a contact hole 19 to allow contact between the data pad 20 and the data line 10 to be formed later. In addition, the gate insulating film 32 on the gate line 3 is patterned by the same photolithography process using the third mask pattern, thus forming a contact hole (not shown) to allow contact between the gate line 3 and the data line 10 in a static electricity preventing circuit. After contact hole 19 is formed, a metal film of Mo material is formed and then patterned using a fourth mask pattern, thereby providing the data line 10, the source electrode 14, the drain electrode 16, and the ground electrode 22. In this case, the data line 10 is connected via the contact hole 19 to the data pad 20, as shown in FIG. 6. Likewise, in the static electricity preventing circuit, the data line 10 is connected, via the contact hole defined at the gate insulating film 32, to the gate line 3, as shown in FIG. 6. Subsequently, using a fifth mask pattern, a transparent electrode material is provided to form a first transparent electrode 35 for the charging capacitor Cst. After the first transparent electrode 35 is provided, a storage insulation film (i.e., dielectric layer) 36 for forming the charging capacitor Cst is provided. A transparent electrode material is then provided on the storage insulation film 36. The transparent electrode material is then etched using a sixth mask pattern to form a second transparent electrode 38. A protective film 40 is then formed. The second transparent electrode 38 serves as an etch stopper for limiting an etching depth of the protective film 40 when forming a contact hole through the protective film 40. In other words, the second transparent electrode 38 protects the storage insulation film 36 in a process of selectively etching the protective film 40 and the storage insulation film 36 when forming of the contact hole. After the second transparent electrode 38 is provided, the protective film 40 of an inorganic or organic material is formed on the entire surface and then patterned using a seventh mask pattern, thereby forming the contact hole 15 for connection between the source electrode 14 and the pixel electrode 5, the contact holes for connection between each of the gate pad 18 and the data pad 20 and the driver IC chip, and the contact hole for connection between the pixel electrode 5 and the second transparent electrode 38. The contact hole 15 for connection between the source electrode 14 and the pixel electrode 5 and the contact holes 17 and 21 for connection between each of the gate pad 18 and the data pad 20 and the driver IC chip are formed through the protective film 40 and the storage insulation film 36, as shown in FIG. 4 and FIG. 5. Consequently, a transparent electrode material is entirely coated and thereafter patterned using an eighth mask pattern, thereby providing the pixel electrode 5. After the pixel electrode 5 is provided, the Mo layers 44 exposed through the contact holes 17 and 21 of the gate pad 18 and the data pad 20 are patterned using a ninth mask pattern to expose their respective Al layers 42. This patterning produces an aluminum structure for connecting the gate pad 18 and the data pad 20 to the driver IC chip by means of the aluminum wire bonding technique having a large adhesive strength.

As described above, the conventional method of fabricating the thin film transistor substrate for the X-ray detector requires a nine step etching process, each step using a different mask. Thus, this conventional method is disadvantageous in view of production, throughput and cost.

SUMMARY OF THE INVENTION

An advantage of the present invention is to provide a method of fabricating a thin film transistor substrate for an X-ray detector that reduces the number of steps in an etching process to improve throughput and reduce cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other objects of the invention, a method of fabricating a thin film transistor substrate for an X-ray detector according to an embodiment of the present invention includes the steps of forming a gate line, a gate pad and a gate electrode of the thin film transistor simultaneously on a certain substrate; providing a gate insulating layer; forming a semiconductor layer of the thin film transistor; forming a data pad, a data line, source and drain electrodes of the thin film transistor and a ground electrode simultaneously; forming an electrode for a charging capacitor; providing an insulating film for the charging capacitor; forming an electrode for preventing an etching of the insulating film for the charging capacitor; forming a protective film for protecting the thin film transistor; forming contact holes in the protective film; and providing a pixel electrode.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiment of the present invention, example of which is illustrated in the accompanying drawings.

Figure 7:
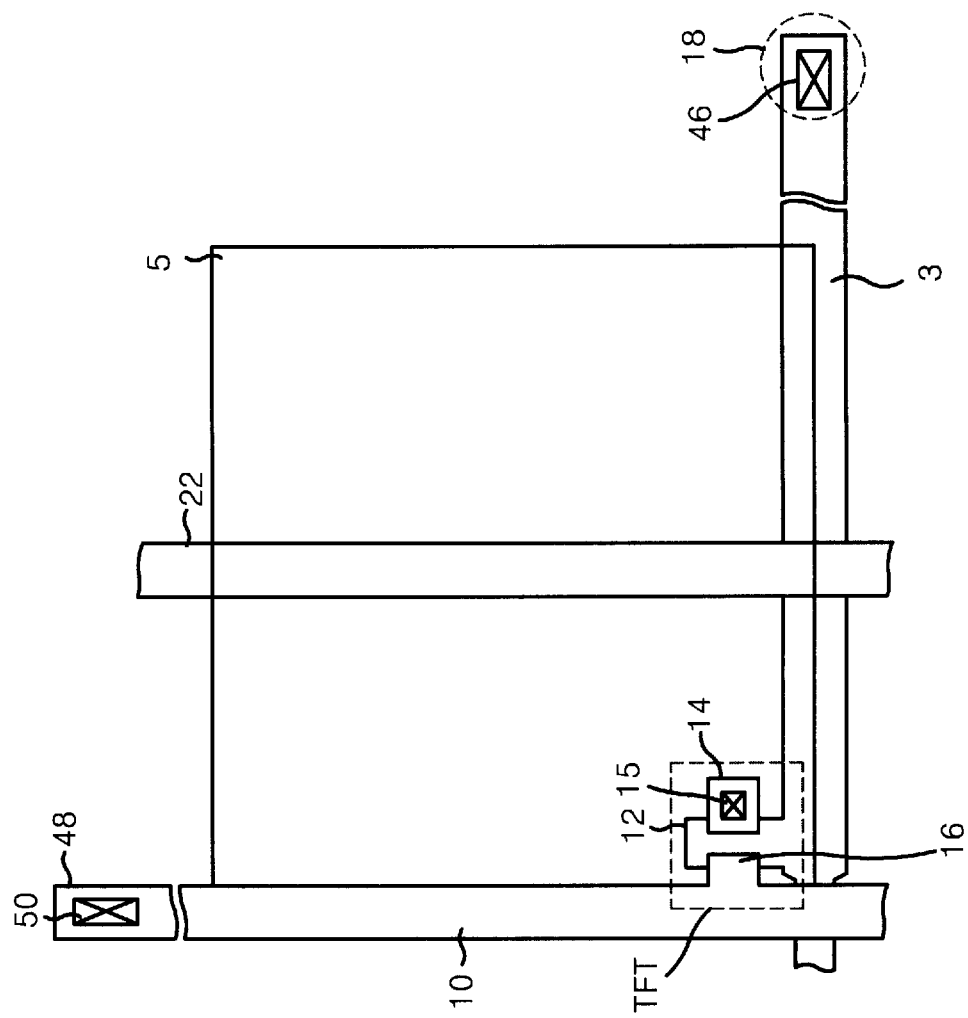
FIG. 7 is a plan view showing structure of a thin film transistor substrate provided using a method of fabricating a thin film transistor substrate for an X-ray detector according to an embodiment of the present invention.

FIG. 7 is a plan view showing a structure provided using a method of fabricating a thin film transistor substrate according to an embodiment of the present invention. In the thin film transistor (TFT) of FIG. 7, a pixel electrode 5 is formed at a unit pixel area defined by a gate line 3 and a data line 10. A charging capacitor Cst (not shown) is formed by the pixel electrode 5 and a transparent electrode (not shown) positioned at the lower portion of the pixel electrode 5 by including an insulating layer (not shown). A ground electrode 22 is formed across the pixel electrode 5 to reset the residual electric charges of the charging capacitor Cst. A TFT is formed at an intersection between the data line 10 and the gate line 3 and consists of a gate electrode 12 extended from the gate line 3, a drain electrode 16 extended from the data line 10, a source electrode 14 connected to the pixel electrode 5 via a contact hole 15, and a semiconductor layer (not shown) connected to the source electrode 14 and the drain electrode 16. One end of the gate line 3 includes a gate pad 18. One end of the data line 10 includes a data pad 48. The gate pad 18 and the data pad 48 connect the gate line 3 and the data line 10 to a driving integrated circuit (IC), respectively. The gate line 3, the gate electrode 12 and the gate pad 18 have a structure in which aluminum (Al) and molybdenum (Mo) are sequentially disposed. Unlike the prior art, the data pad 48 is made from Mo with a thickness equal to the thickness of the data line 10 and is formed in the same layer as the data line. Contact holes 46 and 50 expose Mo layers of the gate pad 18 and the data pad 48 to wire-bond the gate pad 18 and the data pad 48 to the driver IC chip. It is thus possible to achieve adhesion similar to the adhesion of patterned aluminum in the prior art. It is also possible to achieve good pull weight even when the Mo electrode is wire-bonded with the driver IC chip.

Figure 1:
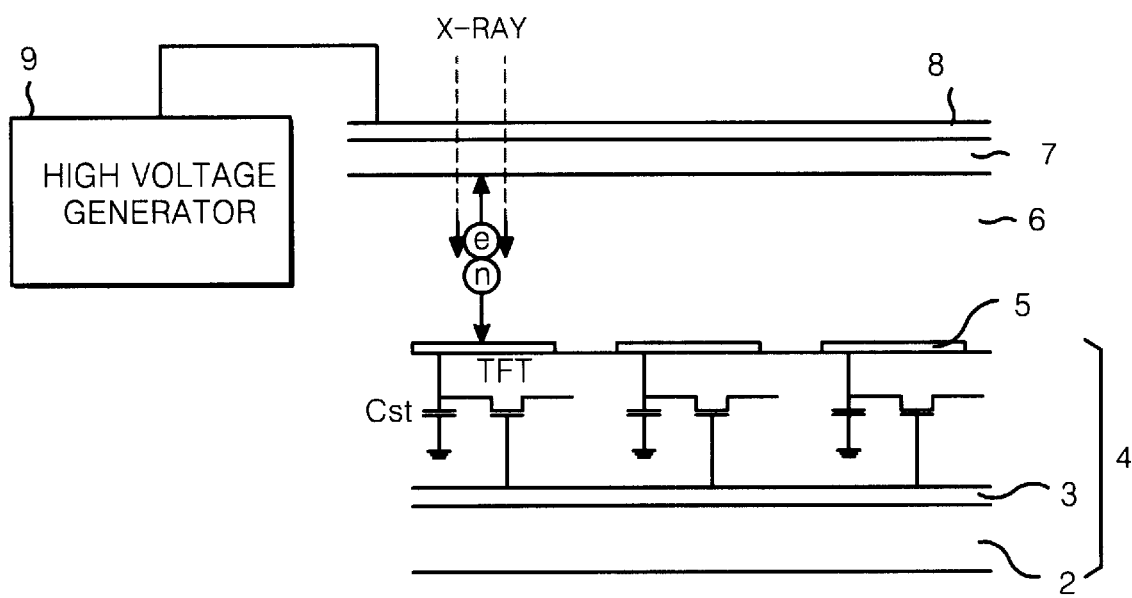
FIG. 1 is a schematic view showing a structure of a conventional X-ray detecting panel.
Figure 2:
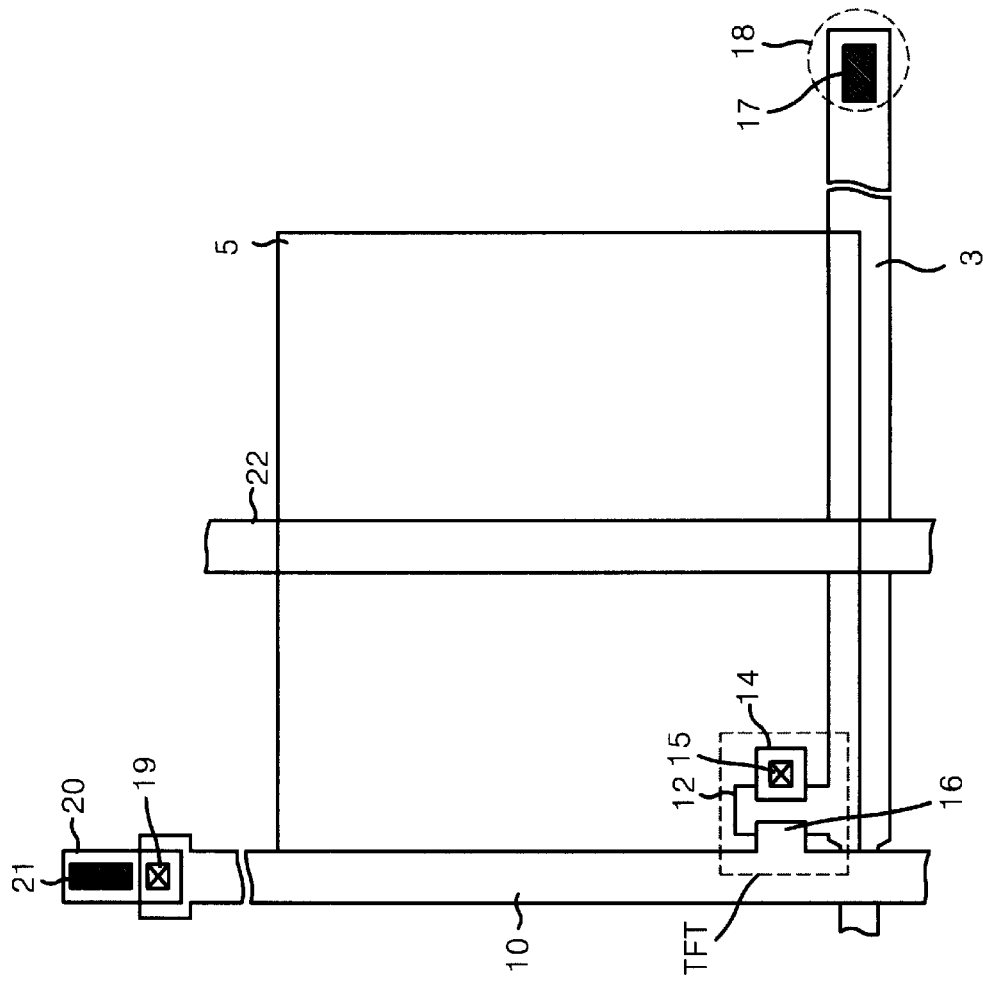
FIG. 2 is a plan view showing a structure of a conventional thin film transistor substrate for an X-ray detector.
Figure 3:
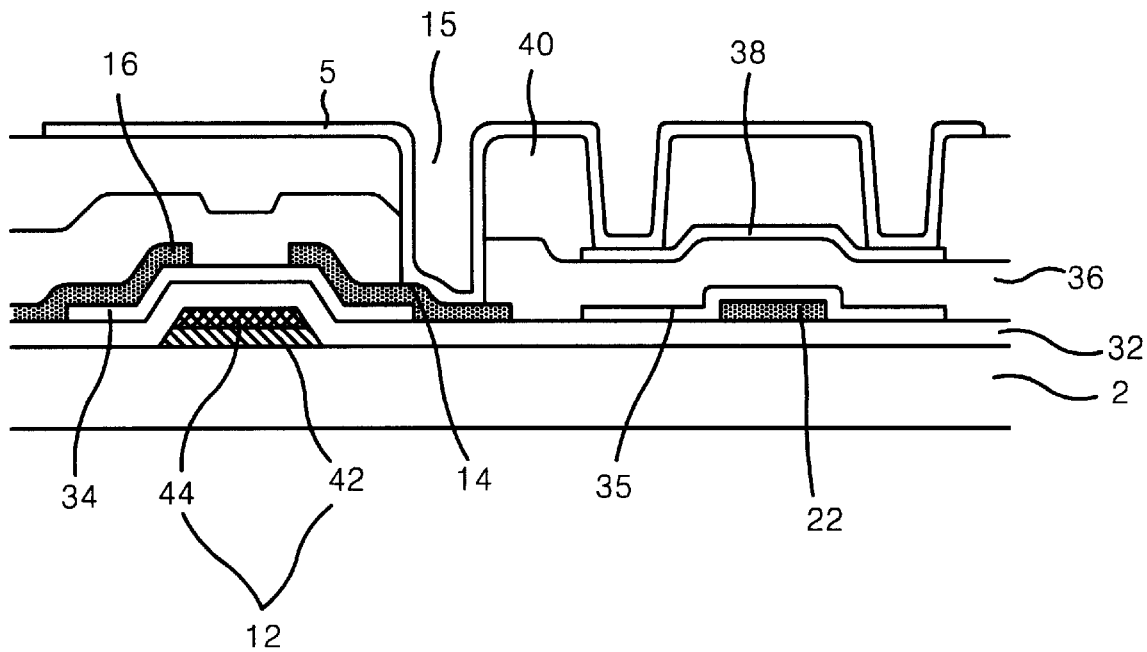
FIG. 3 is a section view showing a vertical structure of the pixel area in FIG. 2.
Figure 4:
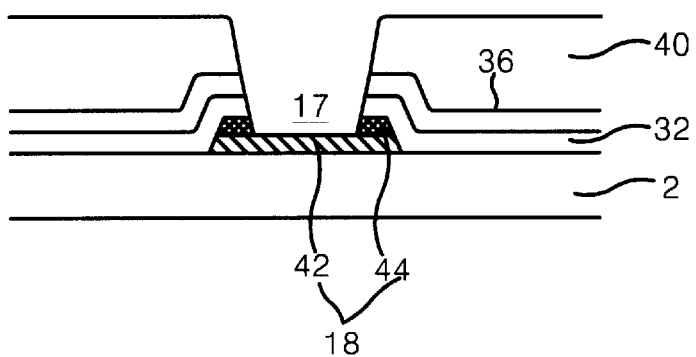
FIG. 4 is a section view showing a vertical structure of the gate pad in FIG. 2.
Figure 5:
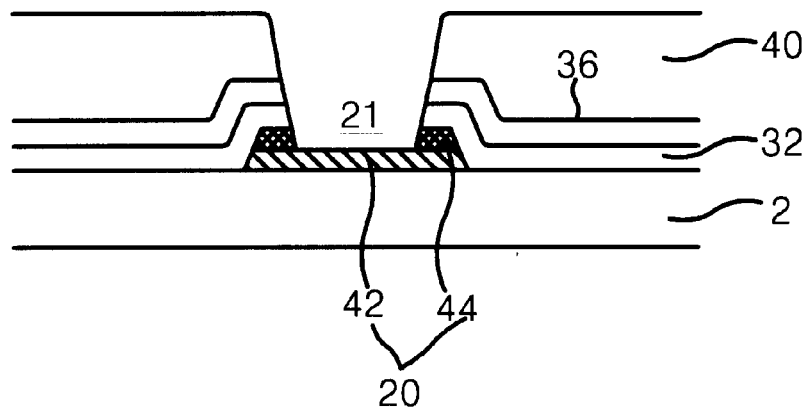
FIG. 5 is a section view showing a vertical structure of the data pad in FIG. 2.
Figure 6:
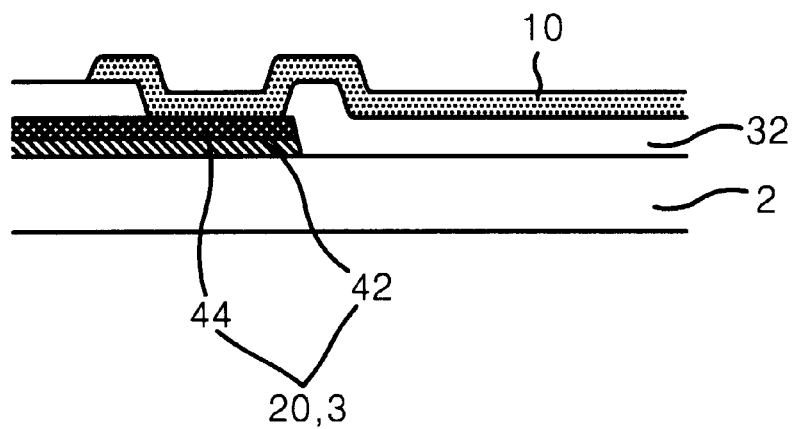
FIG. 6 is a section view showing vertical structures of the gate line to data line link parts of the data link part and the static electricity prevention circuit in FIG. 2.
Figure 8:
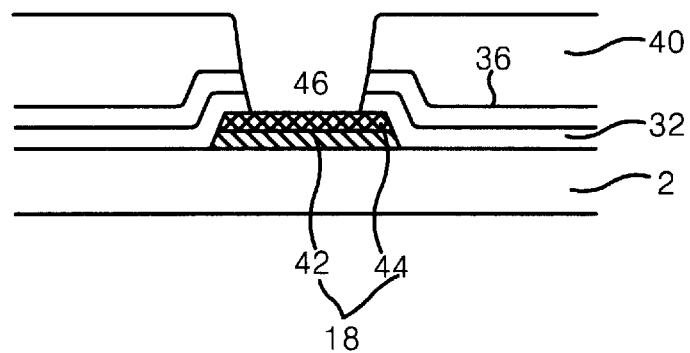
FIG. 8 is a section view showing a vertical structure of the gate pad in FIG. 7.
Figure 9:
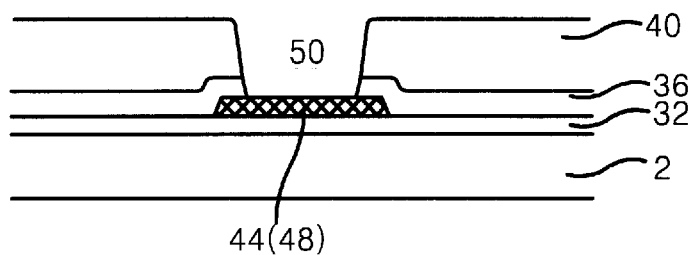
FIG. 9 is a section view showing a vertical structure of the data pad in FIG. 8.
Figure 10:
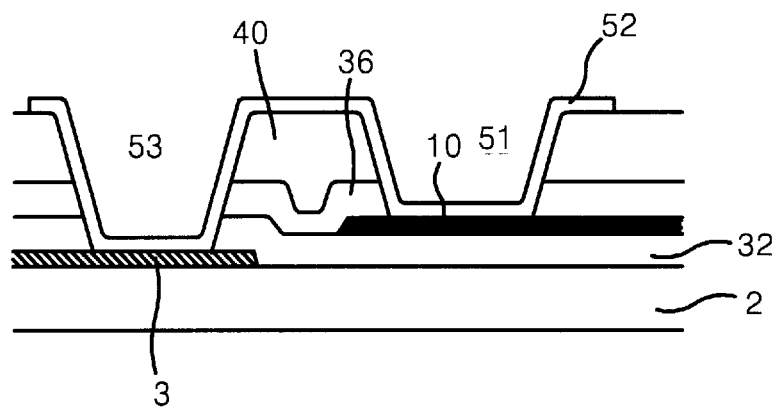
FIG. 10 is a section view showing a vertical structure of the gate line to data line link part of the static electricity prevention circuit in FIG. 7.

The vertical section structure of the pixel area where the thin film transistor is formed is equivalent to that in FIG. 3. The vertical structures of the gate pad, the data pad and the static electricity prevention circuit of the present invention are shown in FIG. 8 to FIG. 10. Hereinafter, a method of fabricating the thin film transistor substrate according to an embodiment of the present invention will be described with reference to FIG. 3, FIG. 5, FIG. 7, FIG. 8 and FIG. 10.

First, a metal film is formed on the glass substrate 2 using vapor deposition. The metal film is then patterned using a first mask pattern to form gate line 3, gate electrode 12 and gate pad 18, simultaneously. In this case, the gate line 3, the gate electrode 12 and the gate pad 18 have a structure in which aluminum (Al) 42 and molybdenum (Mo) 44 are sequentially disposed. A gate insulating film 32 with a thickness of about 4000 Å, an intrinsically doped amorphous silicon layer, and an amorphous silicon layer doped with an impurity, hereinafter referred to as $n^+$ layer, are sequentially formed over the entire surface of the glass substrate 2, including over the gate line 3 and the gate electrode 12, etc. by means of continuous vapor deposition. Next, the $n^+$ layer and the amorphous silicon layer are patterned using a second mask to provide a semiconductor layer 34 forming a channel of the thin film transistor. After the semiconductor layer 34 is formed, a metal film of Mo is formed and then patterned using a third mask pattern, thereby providing data line 10, data pad 48, source electrode 14, drain electrode 16 and ground electrode 22, simultaneously. Subsequently, using a fourth mask pattern, a transparent electrode material is entirely coated to form a first transparent electrode 35 for the charging capacitor Cst. After the first transparent electrode 35 is formed, a storage insulation film (i.e., dielectric layer) 36 for forming the charging capacitor Cst is entirely coated to a thickness of about 3000 Å. The transparent electrode material is entirely coated on the storage insulation film 36 and thereafter patterned using a fifth mask pattern to provide a second transparent electrode 38. This second transparent electrode 38 is etched so as to provide a contact hole in a later-formed protective film 40. In this process, the second transparent electrode serves as an etch stopper for limiting an etching depth of the protective film 40. In other words, the second transparent electrode 38 protects the storage insulation film 36 for selectively etching the protective film 40 and the storage insulation film 36 when forming the contact hole. After the second transparent electrode 38 is formed, the protective film 40 made of an inorganic or organic material is formed on the entire surface of the second transparent electrode 38. The protective film 40 is then patterned using a sixth mask pattern, thereby forming contact holes. More specifically, by the photolithography process using the sixth mask pattern, a contact hole for connection between the source electrode 14 and the second transparent electrode 38 is formed in the protective film 40. Also, a contact hole 15 for connection between the source electrode 14 and the pixel electrode 5 and a contact hole 50 for connection between the data pad 48 and the driver IC chip are formed through the protective film 40 and the storage insulation film 36, as shown in FIG. 3 and FIG. 9. In addition, by the same photolithography process, a contact hole 46 for connection between the gate pad 18 and the driver IC chip is formed through the protective film 40, the storage insulation film 36 and the gate insulating film 32, as shown in FIG. 8. As shown in FIG. 10, first and second contact holes 51 and 53 are formed for connection between the gate line 3 and the data line 10 for the static electricity preventing circuit. The protective film 40, the storage insulation film 36 and the gate insulating film 32 in a pad area where the gate pad 18 and the data pad 48 are positioned may be etched together. The transparent electrode material is coated over the entire surface of the substrate and then patterned using a seventh mask pattern to provide the pixel electrode 5 and a link electrode 52. The link electrode 52 provides connection between the gate line 3 and the data line 10 in the static electricity preventing circuit. Contact holes 46 and 50 expose the Mo layer 44 of the gate pad 18 and the data pad 48, as shown in FIG. 8 and FIG. 9, respectively. Thus, the gate pad 18 and the data pad 48 can be connected to the driver IC chip by means of the wire bonding technique.

As described above, according to the present invention, the data pad and the data line are formed of a molybdenum metal in the same layer, and the molybdenum layers of the data pad and the gate pad are connected to the driver IC chip using a wire bonding technique. As a result, the fabrication method of the thin film transistor substrate according to the present invention reduces the number of steps in the mask etching process from the conventional nine-step mask etching processes to a seven-step mask etching process, thus improving production throughput and reducing cost.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor for an X-ray detector, comprising:

forming a gate line, a gate pad and a gate electrode of the thin film transistor simultaneously on a substrate;

forming a first insulating layer over the gate line, gate pad and gate electrode;

forming a semiconductor layer over the first insulating layer;

forming a data pad, a data line, source and drain electrodes of the thin film transistor and a ground electrode simultaneously;

forming a first electrode for a charging capacitor;

forming a second insulating layer for the charging capacitor;

forming a second electrode for preventing an etching of the second insulating layer for the charging capacitor;

forming a protective film for protecting the thin film transistor;

forming contact holes in the protective film; and forming a pixel electrode connected to the thin film transistor.

2. The method according to claim 1, wherein said forming the contact holes includes:

forming contact holes for exposing the data pad and the gate pad; and forming a contact hole for connection between the data line and the gate line.

3. The method according to claim 2, wherein the connection between the data line and the gate line is part of a static electricity preventing circuit.

4. The method according to claim 2, wherein said forming the pixel electrode further includes forming a link electrode for connection between the data line and the gate line at the static electricity preventing circuit.

5. The method according to claim 1, wherein the gate pad includes an aluminum electrode and a molybdenum electrode that are sequentially disposed, and the data pad is formed of the molybdenum electrode.

6. The method according to claim 5, wherein said contact holes expose the molybdenum electrode of each of the data pad and the gate pad.

7. The method according to claim 1, wherein forming the first insulating layer includes coating the gate line, the gate pad and the gate electrode entirely.

8. The method according to claim 1, wherein forming the second insulating layer coats an entire resultant surface.

9. The method according to claim 1, wherein the data pad and the data line are formed of molybdenum.

10. The method according to claim 9, wherein the data pad and the data line are formed as the same layer.

11. The method according to claim 10, further comprising wire bonding the data pad to a driving circuit.

12. The method according to claim 9, further comprising wire bonding the data pad to a driving circuit.

13. The method according to claim 1, wherein the data pad and the data line are formed as the same layer.

14. The method according to claim 1, further comprising wire bonding the data pad to a driver circuit.

15. A method of fabricating a thin film transistor comprising:

forming a gate line, a gate pad and a gate electrode of the thin film transistor on a substrate;

forming a gate insulating layer on the gate electrode;

forming a semiconductor layer on the gate insulating layer;

forming a data pad, a data line, source and drain electrodes of the thin film transistor and another electrode;

forming a first electrode for a charging capacitor;

forming an insulating film for the charging capacitor;

forming a second electrode for preventing etching of the insulating film;

forming a protective film having a contact hole for protecting the thin film transistor; and forming a pixel electrode on the protective film, the pixel electrode contacting one of the source and data electrodes through the contact hole.

* * * * *